United States Patent
Liou et al.

(10) Patent No.: US 12,295,161 B2
(45) Date of Patent: May 6, 2025

(54) TRENCH ISOLATION HAVING THREE PORTIONS WITH DIFFERENT MATERIALS, AND LDMOS FET INCLUDING SAME

(71) Applicant: GlobalFoundries U.S. Inc., Malta, NY (US)

(72) Inventors: Rong-Ting Liou, Malta, NY (US); Man Gu, Malta, NY (US); Jeffrey B. Johnson, Essex Junction, VT (US); Wang Zheng, Ballston Lake, NY (US); Jagar Singh, Clifton Park, NY (US); Haiting Wang, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 485 days.

(21) Appl. No.: 17/582,550

(22) Filed: Jan. 24, 2022

(65) Prior Publication Data

US 2023/0238428 A1    Jul. 27, 2023

(51) Int. Cl.
 *H10D 62/10* (2025.01)
 *H01L 21/762* (2006.01)
 *H10D 30/01* (2025.01)
 *H10D 30/65* (2025.01)

(52) U.S. Cl.
 CPC ..... *H10D 62/116* (2025.01); *H01L 21/76224* (2013.01); *H10D 30/0281* (2025.01); *H10D 30/65* (2025.01)

(58) Field of Classification Search
 None
 See application file for complete search history.

(56) References Cited

U.S. PATENT DOCUMENTS

| | | | |
|---|---|---|---|
| 9,153,666 B1 | 10/2015 | Iravani et al. | |
| 10,192,746 B1* | 1/2019 | Jha | H01L 29/66795 |
| 10,290,712 B1 | 5/2019 | Ciavatti et al. | |
| 2005/0020088 A1 | 1/2005 | Trivedi | |
| 2006/0049452 A1* | 3/2006 | Tsai | H01L 29/086 |
| | | | 257/E29.133 |
| 2007/0059898 A1 | 3/2007 | Shin et al. | |
| 2009/0020847 A1 | 1/2009 | Byun et al. | |
| 2011/0115047 A1 | 5/2011 | Hebert et al. | |
| 2012/0205776 A1 | 8/2012 | Kemerer et al. | |
| 2014/0131797 A1 | 5/2014 | Chen et al. | |
| 2015/0380316 A1 | 12/2015 | Yu et al. | |

FOREIGN PATENT DOCUMENTS

| | | | |
|---|---|---|---|
| JP | 2011071304 A | 4/2011 | |
| TW | 200512867 A | 4/2005 | |

* cited by examiner

*Primary Examiner* — Alexander G Ghyka
(74) *Attorney, Agent, or Firm* — Francois Pagette; Hoffman Warnick LLC (57) ABSTRACT

An IC structure that includes a trench isolation (TI) in a substrate having three portions of different dielectric materials. The portions may also have different widths. The TI may include a lower portion including a first dielectric material and having a first width, a middle portion including the first dielectric material and an outer second dielectric material, and an upper portion including a third dielectric material and having a second width greater than the first width. The first, second and third dielectric materials are different.

19 Claims, 8 Drawing Sheets

TRENCH ISOLATION HAVING THREE PORTIONS WITH DIFFERENT MATERIALS, AND LDMOS FET INCLUDING SAME

BACKGROUND

The present disclosure relates to integrated circuit structure, and more specifically, to an IC structure and transistor having a trench isolation having three portions with different materials.

SUMMARY

An aspect of the disclosure is directed to an integrated circuit (IC) structure, comprising: a trench isolation (TI) in a substrate, the TI including: a lower portion including a first dielectric material and having a first width; a middle portion including the first dielectric material and an outer second dielectric material; and an upper portion including a third dielectric material and having a second width greater than the first width, wherein the first, second and third dielectric materials are different.

Another aspect of the disclosure is directed to a transistor, comprising: a first source/drain region in a semiconductor substrate and a second source/drain region in the semiconductor substrate; a trench isolation (TI) in the semiconductor substrate, the TI separating the first source/drain region and the second source/drain region, the TI closer to one of the first source/drain region and the second source/drain region, the TI including: a lower portion including a first dielectric material and having a first width, a middle portion including the first dielectric material and an outer second dielectric material, and an upper portion including a third dielectric material and having a second width greater than the first width; and a gate electrode over the semiconductor substrate, the gate electrode overlapping the upper portion of the TI.

Another aspect of the disclosure includes a method comprising: forming a trench isolation (TI) by: forming a pair of spaced first trenches into a semiconductor substrate; forming a middle portion of the TI by filling the pair of spaced first trenches with a first dielectric material, creating a pair of spaced TI sections; forming a second trench through a remaining portion of the semiconductor substrate between the pair of spaced TI sections and through an inner portion of each of the pair of spaced TI sections into the semiconductor substrate; forming a lower portion of the TI by filling the second trench with a second dielectric material; forming a third trench into an upper section of the middle portion of the TI, the lower portion of the TI and the semiconductor substrate adjacent the middle portion of the TI; and forming an upper portion of the TI by filling the third trench with a third dielectric material, wherein the first, second and third dielectric materials are different.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

In addition, several descriptive terms may be used regularly herein, as described below. The terms "first", "second", and "third" may be used interchangeably to distinguish one component from another and are not intended to signify location or importance of the individual components.

Embodiments of the disclosure include an integrated circuit (IC) structure that includes a trench isolation (TI) in a substrate having three portions of different dielectric materials. The portions may also have different widths. The TI may include a lower portion including a first dielectric material and having a first width; a middle portion including the first dielectric material and an outer second dielectric material; and an upper portion including a third dielectric material and having a second width greater than the first width. The first, second and third dielectric materials are different. The TI may be used with any form of transistor but finds special advantage relative to a laterally diffused metal-oxide semiconductor (LDMOS) FET, used for example, in radio frequency applications such as WiFi power amplifiers. The TI in this setting reduces gate-drain capacitance (Cgd), and may, for example, enable sub-six gigahertz (6 GHz) WiFi power amplifier applications. The TI formation presents minimal fabrication changes.

Referring to FIGS. 1-8, a method of forming an integrated circuit (IC) structure 90 (FIG. 8) including a trench isolation 92 (FIG. 8) (hereafter "TI 92") according to embodiments of the disclosure will be initially described. IC structure 90 may also include a transistor 94 (FIG. 8), such as an LDMOS FET, using TI 92.

Figure 1:
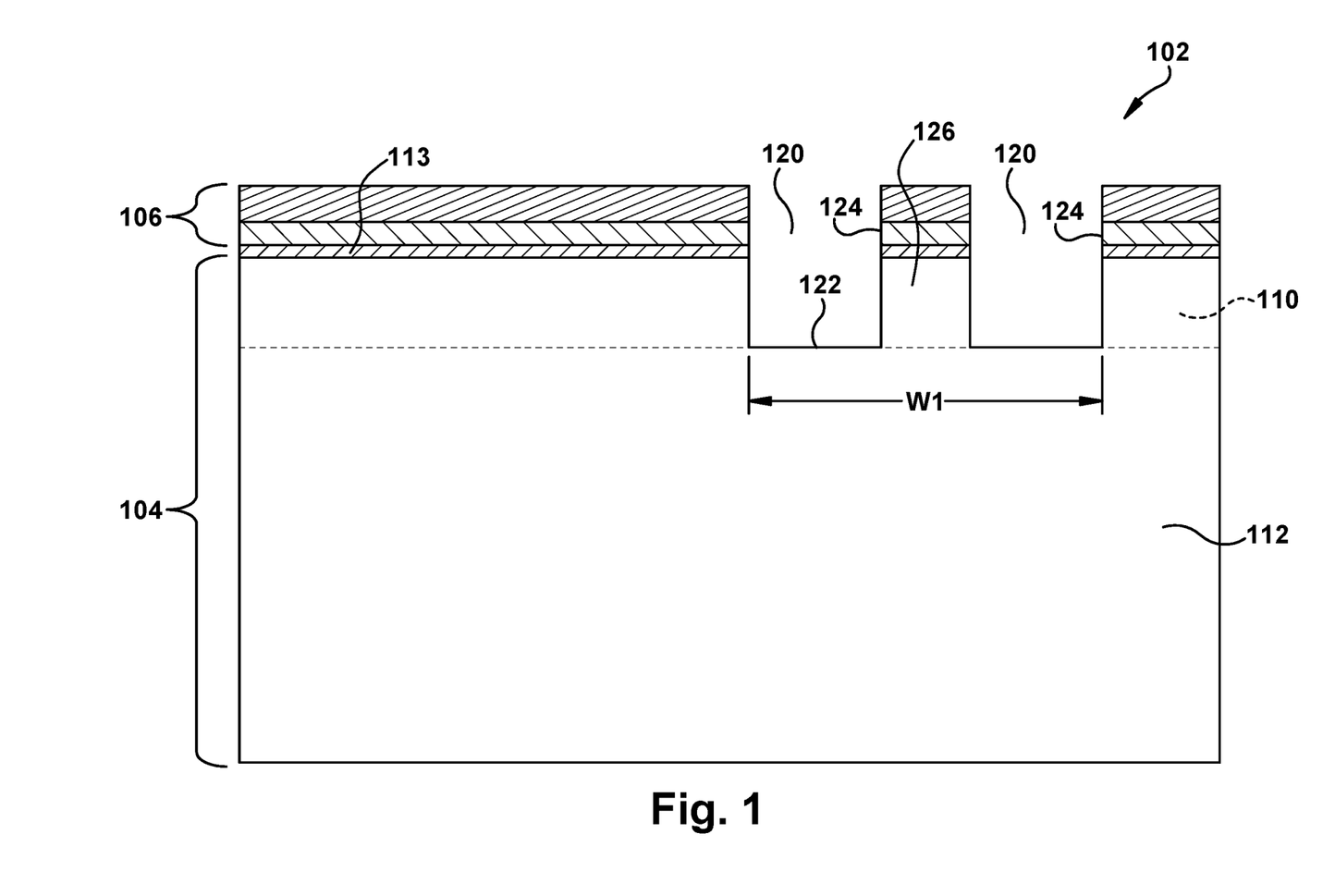
FIG. 1 shows a cross-sectional view of an initial structure and forming a pair of spaced first trenches, according to embodiments of the disclosure.
Figure 8:
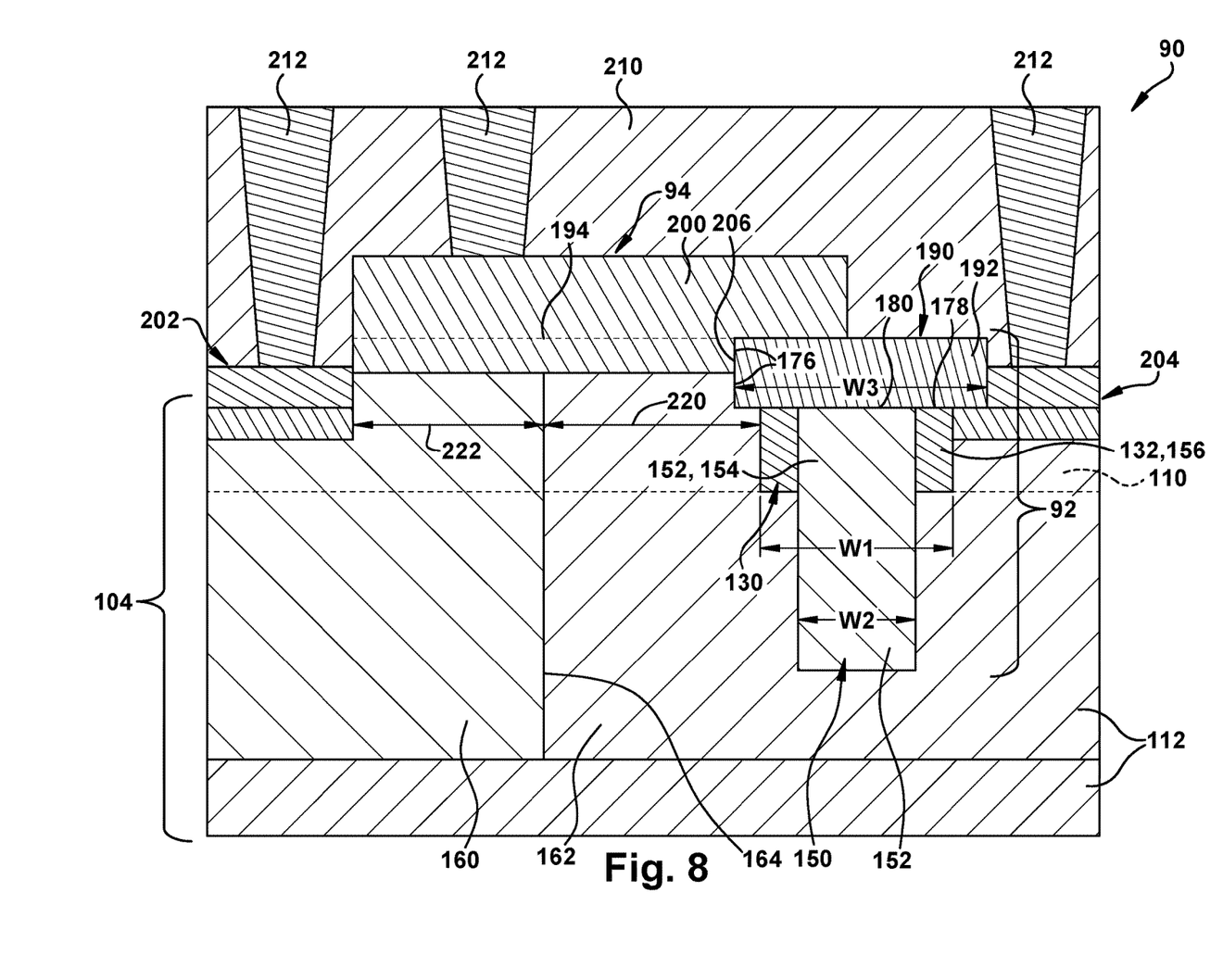
FIG. 8 shows a cross-sectional view of an IC structure, a transistor, a trench isolation, and forming a gate electrode and source/drain regions for the transistor, according to embodiments of the disclosure.

FIG. 1 shows a cross-sectional view of an initial structure 102 including a substrate 104 having a patterned mask 106 thereover. Initial structure 102 may have undergone a variety of well-known semiconductor fabrication processes leading to this stage, which are not pertinent to the instant disclosure. Substrate 104 may include any now known or later developed semiconductor substrates, e.g., bulk semiconductor substrates. For purposes of description, substrate 104 may include an upper portion 110, which may be an upper surface of a bulk semiconductor substrate (where layer 112 is a bulk semiconductor substrate), or a semiconductor fin over a base semiconductor layer 112. Where upper portion 110 is a semiconductor fin, the fin is set into the page and extends side-to-side on the page, and hence, is indicated with a dashed line. Mask 106 may include any now known or later developed mask material such as but not limited to layers of silicon nitride and oxide. Portions of substrate 104 may be doped with an appropriate dopant for the desired polarity of FET to be formed thereon, e.g., a p-type dopant. A cap layer 113 maybe over substate 104, e.g., upper portion 110. As shown in FIG. 1, the method may include forming a pair of spaced first trenches 120 into semiconductor substrate 104. First trenches 120 may extend through upper portion 110, i.e., to an upper surface 122. First trenches 120 may be formed, for example, by patterning mask 106 to have openings 124 therein, and then using any appropriate etching process, e.g., a reactive ion etch (RIE), for the materials to be removed. Mask 106 may be that used to define a length of upper portion 110, e.g., as would be used to form diffusion breaks in a semiconductor fin or other bulk semiconductor substrates at locations other than shown here. Hence, this step shown in FIG. 1 does not represent any additional processing steps other than opening mask 106 at additional locations for first trenches 120. Mask 106 may include other openings (not shown) for diffusion breaks in upper portion 110, e.g., a semiconductor fin. A distance between outer edges of trenches 120 can be controlled to size a width W1 of a middle portion 130 (FIG. 8) of TI 92 (FIG. 8). After first trenches 120 are formed, a remaining portion 126 of semiconductor substrate 104 (e.g., upper portion 110 as a fin) remains between first trenches 120.

Figure 2:
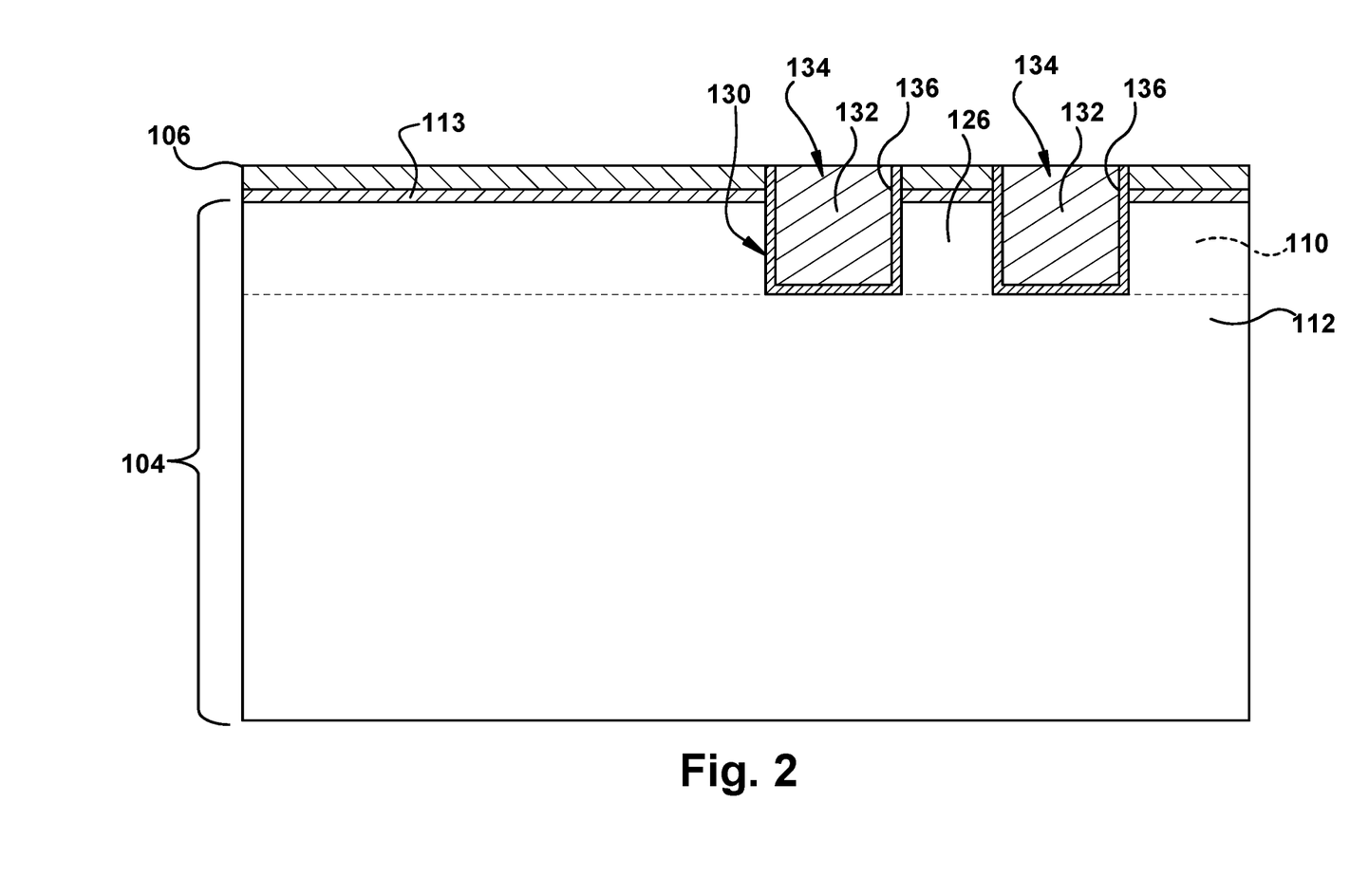
FIG. 2 shows a cross-sectional view of forming a middle portion of a trench isolation, according to embodiments of the disclosure.

FIG. 2 shows a cross-sectional view of forming a middle portion 130 of TI 92 by filling pair of spaced first trenches 120 (FIG. 1) with a dielectric material 132, creating a pair of spaced TI sections 134. The forming step may include depositing dielectric material 132 in pair of spaced first trenches 120 (FIG. 1), i.e., using any appropriate deposition technique such as but not limited to atomic layer deposition (ALD) and chemical vapor deposition (CVD). Dielectric material 132 may include, for example, undoped silicate glass (USG) or any other dielectric material typically used for diffusion breaks. Dielectric material 132 may also be used to form diffusion breaks at other locations (not shown) on IC structure 90. Before depositing dielectric material 132, an oxide liner 136 may be formed in trenches 120 (FIG. 1). Oxide liner 136 may include, for example, an in-situ steam generated (ISSG) oxide. Any required planarization process may be performed to remove excess material, and mask 106 may be removed using any appropriate process, e.g., an ashing process.

Figure 3:
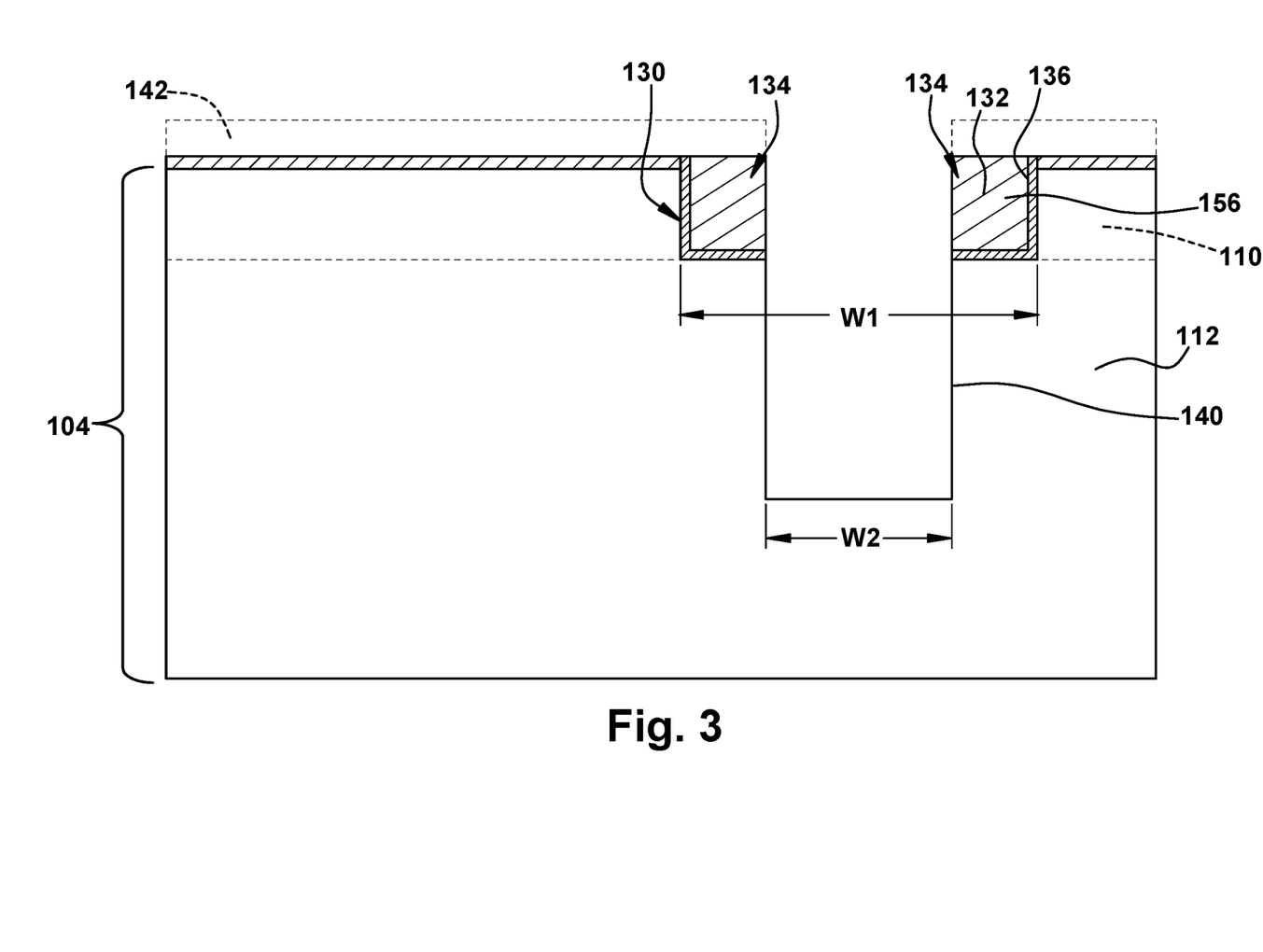
FIG. 3 shows a cross-sectional view of forming a second trench through the middle portion of the trench isolation, according to embodiments of the disclosure.

FIG. 3 shows a cross-sectional view of forming a second trench 140 through remaining portion 126 (FIG. 2) of semiconductor substrate 104 (e.g., upper portion 110) between pair of spaced TI sections 134 and through an inner portion 144 of each of pair of spaced TI sections 134 into semiconductor substrate 104, i.e., base semiconductor layer 112. Second trench 140 may be formed, for example, by using a patterned mask 142 and etching, e.g., a RIE, through remaining portion 126 (FIG. 2) of semiconductor substrate 104 (e.g., upper portion 110), removing inner portions 144 of TI sections 134. Mask 142 may be that used to form 'regular' shallow or deep trench isolations (not shown) throughout IC structure 90 (FIG. 8) to electrically isolate various devices. Hence, this step does not represent any additional processing steps other than other than opening mask 142 at additional locations for second trench(es) 140. Second trench 140 extends through upper portion 110, e.g., semiconductor fin and into the semiconductor layer therebelow. Second trench 140 may have a width (W2) and any depth typically provided for shallow trench isolations or deep trench isolations. Width W2 is less than width W1 of the previously formed middle portion 130 (FIG. 7) of TI 92 (FIG. 8). Mask 142 may be removed using any appropriate process, e.g., an ashing process.

Figure 4:
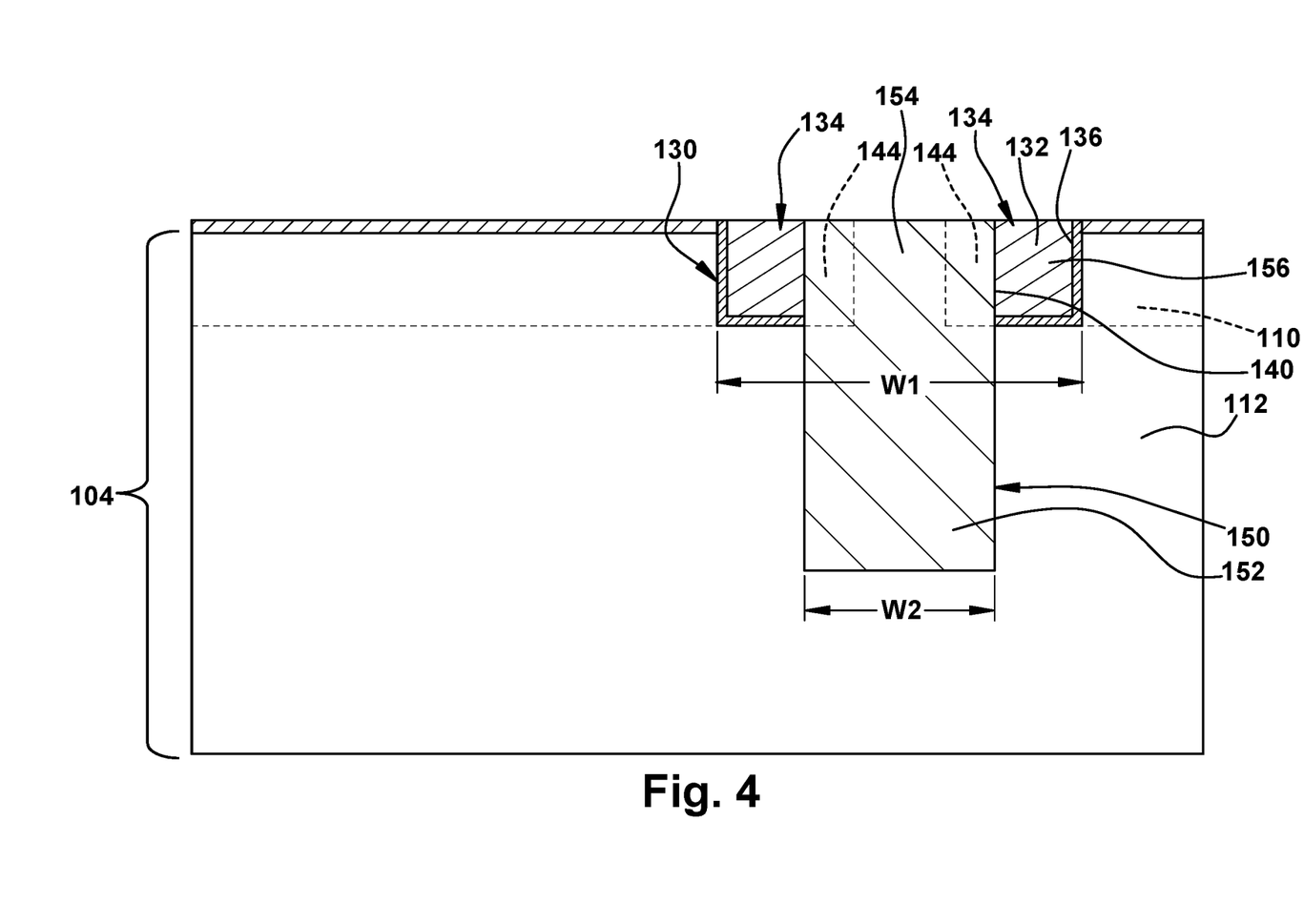
FIG. 4 shows a cross-sectional view of forming a lower portion of the trench isolation, according to embodiments of the disclosure.

FIG. 4 shows a cross-sectional view of forming a lower portion 150 of TI 92 by filling second trench 140 with a dielectric material 152. The forming step may include depositing dielectric material 152 in second trench 140, i.e., using any appropriate deposition technique such as but not limited to atomic layer deposition (ALD) and chemical vapor deposition (CVD). Dielectric material 152 may include, for example, a flowable chemical vapor deposited (FCVD) oxide or other dielectric typically used for shallow or deep trench isolations. As shown, because second trench 140 (FIG. 3) extends through middle portion 130, the now refilled middle portion 130 includes an inner portion 154 of dielectric material 152 (on an inside thereof) and an outer portion 156 of dielectric material 132. Any required planarization process may be performed to remove excess dielectric material 152.

Figure 5:
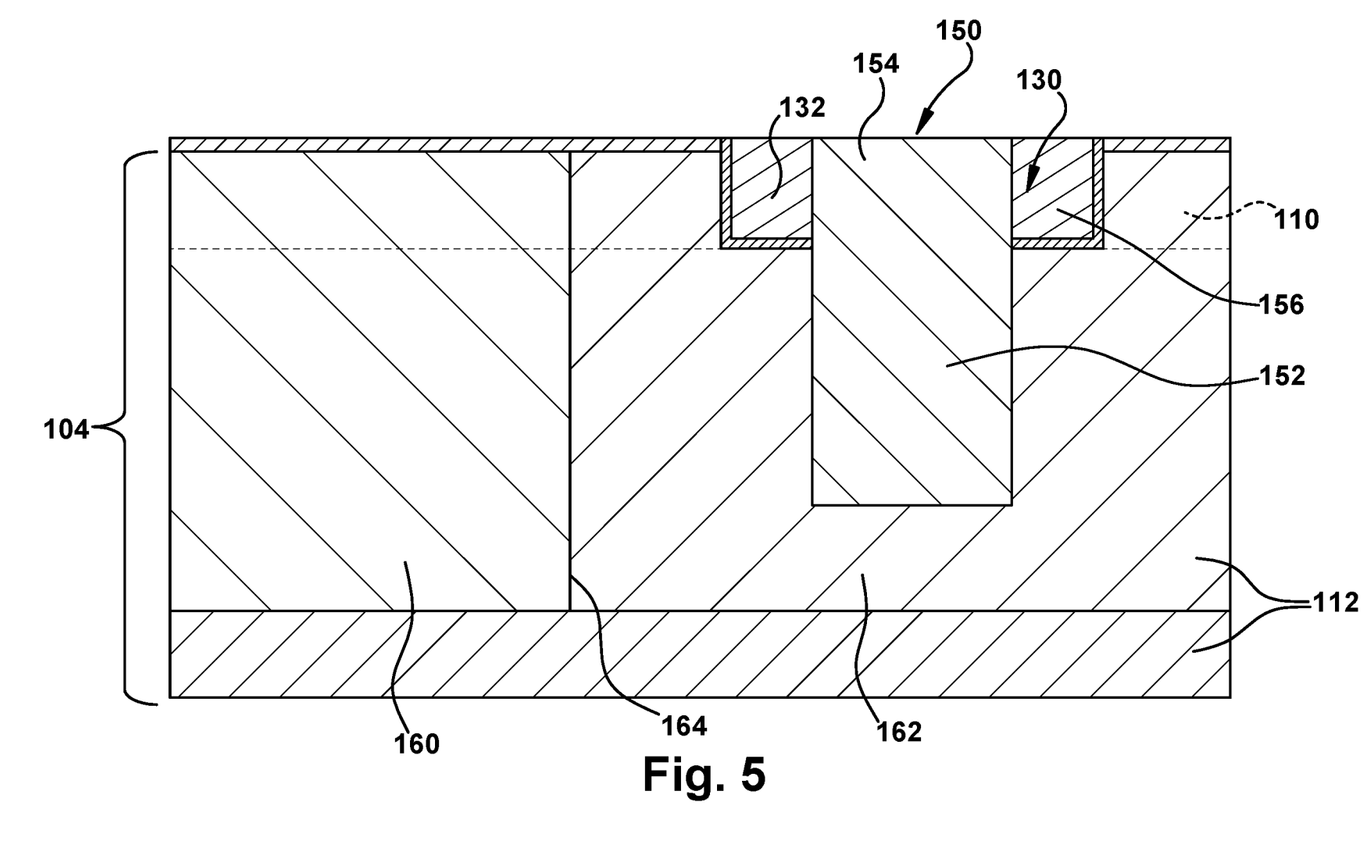
FIG. 5 shows a cross-sectional view of forming wells in a semiconductor substrate, according to embodiments of the disclosure.

FIG. 5 shows a cross-sectional view of forming a first well 160 and a second well 162 in semiconductor substrate 104. First well 160 and second well 162 may be formed using any now known or later developed doping process, e.g., ion implantation. First well 160 and second well 162 include different dopants. For example, first well 160 may include a p-type dopant, and second well 162 may include a n-type dopant. The dopant types and dopant concentrations used may vary depending on the polarity of transistor 94 (FIG. 8) to be formed. First well 160 and second well 162 create a junction 164. As shown, lower portion 150 and middle portion 130 of TI 92 (FIG. 8) are in second well 162.

Figure 6:
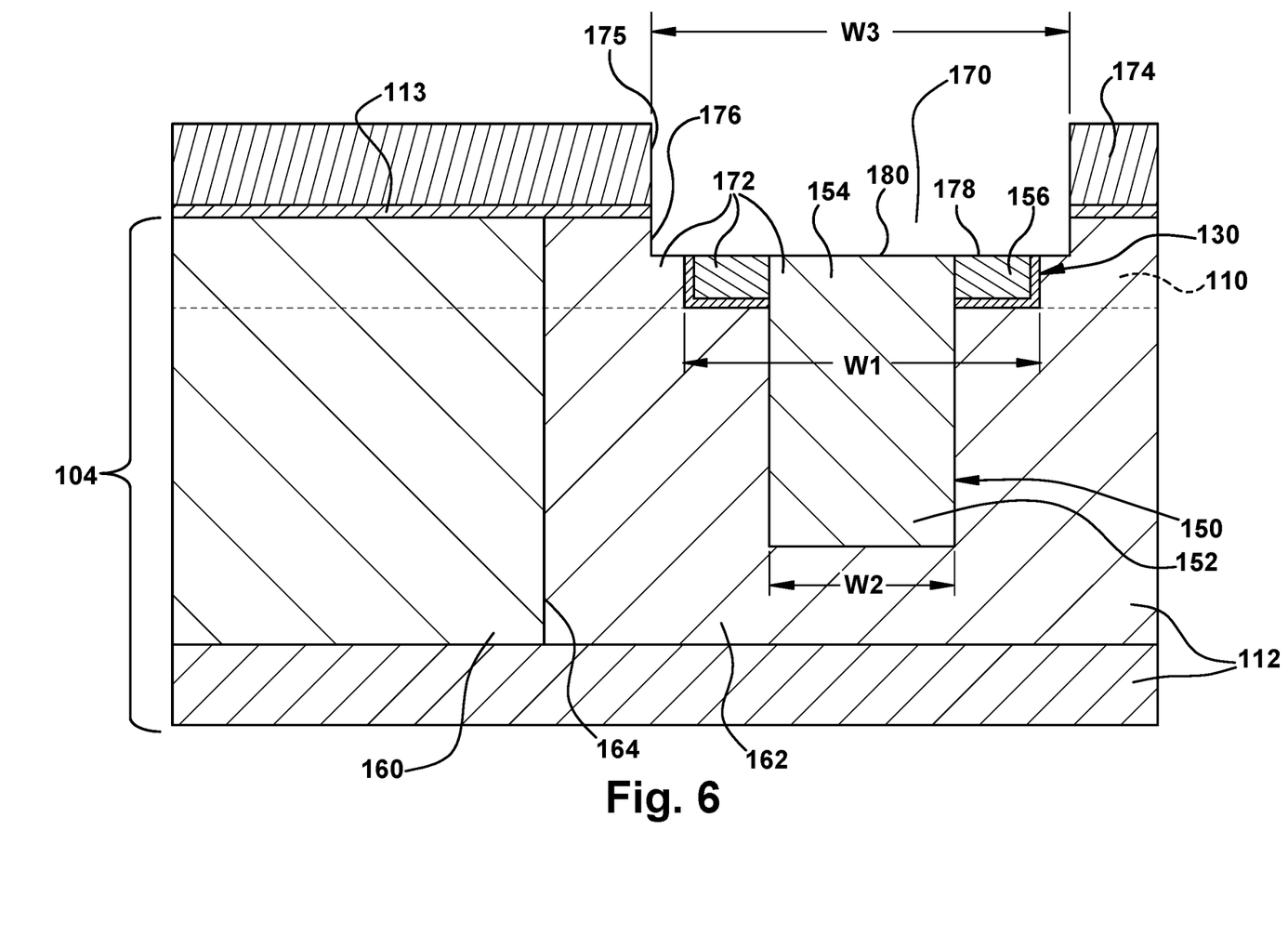
FIG. 6 shows a cross-sectional view of forming a third trench over the middle portion of the trench isolation, according to embodiments of the disclosure.

FIG. 6 shows a cross-sectional view of forming a third trench 170 into an upper section 172 of middle portion 130 and semiconductor substrate 104 adjacent the middle portion 130. Third trench 170 may be formed, for example, by using a patterned mask 174 and etching, e.g., a RIE, into upper section 172 of middle portion 130 and semiconductor substrate 104 adjacent the middle portion 130. An opening 175 of mask 174 has a width W3 greater than width W1 of middle portion 130, exposing portions of semiconductor substrate 104, e.g., upper portion 110. Mask 174 may be that used for upper portion 110 reveal and/or diffusion break formation, and hence, this step does not represent any additional processing steps other than forming additional opening 175. Third trench 170 extends into upper portion 110, revealing a sidewall 176 of upper portion 110 and upper surfaces 178, 180 of middle portion 130, i.e., upper surfaces 178 of outer portion 156 and upper surface 180 of inner portion 154 of middle portion 130. Second trench 140 may have width W3, and any depth typically provided for semiconductor fin reveal. Mask 174 may be removed using any appropriate process, e.g., an ashing process.

Figure 7:
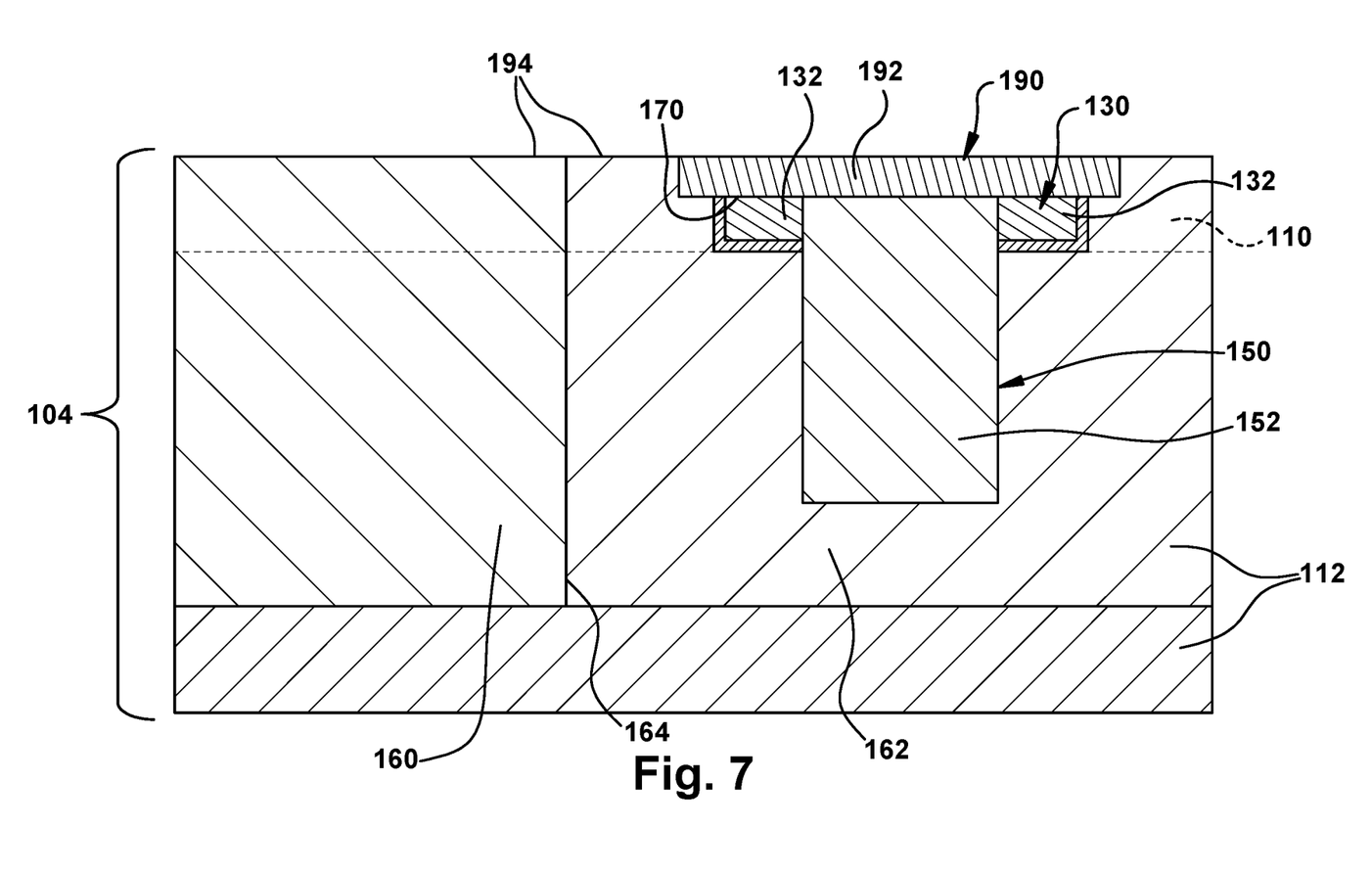
FIG. 7 shows a cross-sectional view of forming an upper portion of the trench isolation, according to embodiments of the disclosure.

FIG. 7 shows a cross-sectional view of forming an upper portion 190 of TI 92 (FIG. 8) by filling third trench 170 with a dielectric material 192. The forming step may include depositing dielectric material 192 in third trench 170, i.e., using any appropriate deposition technique such as but not limited to plasma-enhanced chemical vapor deposition (PE-CVD). Dielectric material 192 may include, for example, high density plasma (HDP) oxide or other dielectric typically used for filling openings adjacent ends of upper portion 110, e.g., a semiconductor fin where so provided. Hence, dielectric material 132, dielectric material 152 and dielectric material 192 are different, i.e., they are all different materials and/or different configurations of a material. Upper portion 190 may have width W3, i.e., same as third trench 170 (FIG. 6). Because third trench 170 (FIG. 6) exposes upper surface 178, 180 of dielectric materials 132, 152 in middle portion 130, respectively, dielectric material 192 deposited therein is on dielectric materials 132, 152, i.e., dielectric material 192 contacts dielectric materials 132, 152 of inner and outer portions 154, 156, respectively, of middle portion 130. Any required planarization process may be performed to remove excess material. Here, the planarization reveals an upper surface 194 of upper portion 110 of substrate 104, e.g., semiconductor fin. An upper surface 196 of dielectric material 192 may be coplanar with upper surface 194 of upper portion 110 of substrate 104, e.g., semiconductor fin.

FIG. 8 shows a cross-sectional view of forming a gate electrode 200 over semiconductor substrate 104 and forming a first source/drain (S/D) region 202 in semiconductor substrate 104 and a second source/drain (S/D) region 204 in semiconductor substrate 104. Gate electrode 200 and first and second S/D regions 202, 204 may be formed using any now known or later developed semiconductor device fabrication processes. In one non-limiting example, a replacement metal gate (RMG) process may be used in which a dummy gate material is formed over semiconductor substrate 104, followed by doping ends of upper portion 110 (e.g., semiconductor fin 110) to form parts of S/D regions 202, 204, epitaxially growing semiconductor material on ends of upper portion 110 for other parts of S/D regions 202, 204, and performing any necessary anneals to create S/D regions 202, 204. Subsequently, the dummy gate material may be replaced with any appropriate metal gate material(s) to form gate electrode 200 as illustrated. Other gate electrode and S/D region formation processes are also possible. As shown in FIG. 8, gate electrode 200 may overlap upper portion 190 of TI 92 and is adjacent to a sidewall 206 of upper portion 190 of TI 92, i.e., dielectric material 192. Junction 164 between first well 160 and second well 162 is under gate electrode 200. Some subsequent and conventional interconnect processing is also shown in FIG. 8, e.g., depositing an interlayer dielectric 210 and forming contacts 212 to gate electrode 200 and S/D regions 202, 204.

FIG. 8 also shows a cross-sectional view of IC structure 90 including TI 92 and transistor 94 according to embodiments of the disclosure. TI 92 includes lower portion 150 including dielectric material 152. Lower portion 150 has the same width W2 as second trench 140 (FIG. 3). TI 92 also includes middle portion 130 including dielectric material 132 (inner portion 154) and an outer dielectric material 152 (outer portion 156). TI 92 may also include upper portion 190 including dielectric material 192 and having width W3 greater than width W1 of lower portion 150. Outer portion 156 of dielectric material 132 of middle portion 130 has width W1 between width W2 of lower portion 150 and width W3 of upper portion 190 in size. As noted, dielectric materials 132, 152 and 192 are different. Dielectric material 192 is on dielectric materials 132, 152 of middle portion 130, i.e., they contact.

Transistor 94 may further include gate electrode 200 over substrate 104. Gate electrode 200 overlaps upper portion 190 of TI 92 and is adjacent to sidewall 206 of dielectric material 192 of upper portion 190 of TI 92. Transistor 94 also includes first S/D 202 and second S/D region 204 in substrate 104, e.g., in upper portion 110. TI 92 and gate electrode 200 are in between first S/D region 202 and second S/D region 204. First S/D region 202 is positioned in first well 160 in substrate 104 and second S/D region 204 is positioned in second well 162 in substrate 104 adjacent to first well 160. TI 92 is positioned in second well 162, and first well 160 and second well 162 define junction 164 underneath gate electrode 200. In certain embodiments, substrate 104 of IC structure 90 may include upper portion 110 as a semiconductor fin over a base semiconductor layer, i.e., layer 112. In this case, TI 92 may be positioned partially in upper portion 110 (e.g., semiconductor fin), as shown in FIG. 8. Lower portion 150 of TI 92 extends into base semiconductor layer 112.

Transistor 94 according to embodiments of the disclosure may include an LDMOS FET. Transistor 94 includes first S/D region 202 in semiconductor substrate 104 and second S/D region 204 in semiconductor substrate 104, and gate electrode over semiconductor substrate 104, e.g., upper portion 110. First S/D region 202 is positioned in first well 160 in semiconductor substrate 104 and second S/D region 204 is positioned in second well 162 in semiconductor substrate 104 adjacent to first well 160. First well 160 and second well 162 define junction 164 underneath gate electrode 200, and TI 92 is positioned in second well 162. Hence, transistor 94 also includes TI 92, which is closer to second S/D region 204 than first S/D region 202, creating drain extension 220. Gate electrode 200 overlaps upper portion 190 of TI 92. Gate electrode 200 may also be adjacent to sidewall 206 of dielectric material 192 of upper portion 190 of TI 92. TI 92 and gate electrode 200 are (laterally) in between first S/D region 202 and second S/D region 204. Transistor 94 has a channel 222 under gate electrode 200. A position of junction 164 of first and second wells 160, 162 may define a channel 222 length, and a position of TI 92 may define a length of drain extension 220.

IC structure 90 including transistor 94 having TI 92 are applicable, for example, as an LDMOS FET for use in radio frequency (RF) applications such as WiFi power amplifiers. The TI in this setting reduces gate-drain capacitance (Cgd), and may, for example, enable sub-six gigahertz (6 GHz) WiFi power amplifier applications. IC structure 90 may also improve threshold frequency to maximum frequency (Ft/Fmax) performance. However, as described, TI 92 formation presents minimal fabrication changes. While TI 92 has been described herein as applicable to a transistor 94 in the form of an LDMOS FET, it will be recognized that TI 92 is also applicable for transistors other than LDMOS FETs. TI 92 may be formed in multiple locations in IC structure 90.

The structure and method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
    a trench isolation (TI) in a substrate, the TI including:
        a lower portion including a first dielectric material and having a first width;
        a middle portion including the first dielectric material and an outer second dielectric material; and
        an upper portion including a third dielectric material and having a second width greater than the first width,
        wherein the first, second and third dielectric materials are different,
        wherein the third dielectric material contacts the first dielectric layer at a first portion of a material interface and the second dielectric material at a second portion of the material interface, and the third dielectric material has an uppermost surface coplanar with an uppermost surface of the substrate.

2. The IC structure of claim 1, wherein the outer second dielectric material has a third width between the first width and the second width in size.

3. The IC structure of claim 1, wherein the third dielectric material is on the first and second dielectric materials.

4. The IC structure of claim 1, further comprising a gate electrode over the substrate, the gate electrode overlapping the upper portion of the trench isolation, and adjacent to an upper sidewall and above a lower sidewall, of the third dielectric material of the upper portion of the trench isolation.

5. The IC structure of claim 4, further comprising a first source/drain region and a second source/drain region in the substrate, and wherein the TI and the gate electrode are in between the first source/drain region and the second source/drain region.

6. The IC structure of claim 5, wherein the first source/drain region is positioned in a first well in the substrate and the second source/drain region is positioned in a second well in the substrate adjacent to the first well.

7. The IC structure of claim 6, wherein the TI is positioned in the second well, and the first well and the second well define a junction underneath the gate electrode.

8. The IC structure of claim 1, wherein the substrate includes a semiconductor fin over a base semiconductor layer, and the TI is positioned partially in the semiconductor fin.

9. The IC structure of claim 8, wherein the lower portion of the TI extends into the base semiconductor layer.

10. A transistor, comprising:
a first source/drain region in a semiconductor substrate and a second source/drain region in the semiconductor substrate;
a trench isolation (TI) in the semiconductor substrate, the TI separating the first source/drain region and the second source/drain region, the TI closer to one of the first source/drain region and the second source/drain region, the TI including:
a lower portion including a first dielectric material and having a first width,
a middle portion including the first dielectric material and an outer second dielectric material, and
an upper portion including a third dielectric material and having a second width greater than the first width, wherein the third dielectric material contacts the first dielectric layer at a first portion of a material interface and the second dielectric material at a second portion of the material interface, and the third dielectric material has an uppermost surface coplanar with an uppermost surface of the semiconductor substrate; and
a gate electrode over the semiconductor substrate, the gate electrode overlapping the upper portion of the TI.

11. The transistor of claim 10, wherein the outer second dielectric material has a third width between the first width and the second width in size.

12. The transistor of claim 10, wherein the gate electrode is adjacent to an upper sidewall and above a lower sidewall, of the third dielectric material of the TI.

13. The transistor of claim 10, wherein the TI and the gate electrode are in between the first source/drain region and the second source/drain region.

14. The transistor of claim 10, wherein the first source/drain region is positioned in a first well in the semiconductor substrate and the second source/drain region is positioned in a second well in the semiconductor substrate adjacent to the first well, wherein the first well and the second well define a junction underneath the gate electrode and the trench isolation is positioned in the second well.

15. The transistor of claim 10, wherein the semiconductor substrate includes a semiconductor fin over a base semiconductor layer, and the lower portion extends into the base semiconductor layer.

16. A method comprising:
forming a trench isolation (TI) by:
forming a pair of spaced first trenches into a semiconductor substrate;
forming a middle portion of the TI by filling the pair of spaced first trenches with a first dielectric material, creating a pair of spaced TI sections;
forming a second trench through a remaining portion of the semiconductor substrate between the pair of spaced TI sections and through an inner portion of each of the pair of spaced TI sections into the semiconductor substrate;
forming a lower portion of the TI by filling the second trench with a second dielectric material;
forming a third trench into an upper section of the middle portion of the TI and the semiconductor substrate adjacent the middle portion of the TI; and
forming an upper portion of the TI by filling the third trench with a third dielectric material, wherein the third dielectric material contacts the first dielectric layer at a first portion of a material interface and the second dielectric material at a second portion of the material interface, and the third dielectric material has an uppermost surface coplanar with an uppermost surface of the semiconductor substrate,
wherein the first, second and third dielectric materials are different.

17. The method of claim 16, wherein the lower portion of the TI has a first width, the middle portion of the TI has a second width, and the upper portion of the TI has a third width, wherein the first, second and third widths are different.

18. The method of claim 16, wherein the upper portion of the TI contacts the middle portion of the TI and the lower portion of the TI.

19. The method of claim 16, further comprising:
forming a first well and a second well in the semiconductor substrate, wherein the first and second well include different dopants;
forming a gate electrode over the semiconductor substrate, wherein the gate electrode overlaps the upper portion of the TI and is adjacent to an upper sidewall and above a lower sidewall of the upper portion of the TI, and the first well and the second well form a junction under the gate electrode; and
forming a first source/drain region in the semiconductor substrate and a second source/drain region in the semiconductor substrate,
wherein the TI and the gate electrode are in between the first source/drain region and the second source/drain region, and the TI is in one of the first well and the second well.

* * * * *